United States Patent [19]
Mil'shtein et al.

[11] Patent Number: 5,945,833
[45] Date of Patent: Aug. 31, 1999

[54] METHOD FOR TESTING SEMICONDUCTOR DEVICES WHICH MEASURES INTERNAL POTENTIAL DISTRIBUTION, INTERNAL ELECTRIC FIELD, AND INTERNAL DOPING PROFILE

[75] Inventors: Samson Kh. Mil'shtein, Chelmsford; Joel M. Therrien, Grafton, both of Mass.

[73] Assignee: University of Massachusetts, Boston, Mass.

[21] Appl. No.: 08/757,468

[22] Filed: Nov. 27, 1996

[51] Int. Cl.$^6$ .................................................. G01R 31/305
[52] U.S. Cl. ............................................ 324/751; 250/310
[58] Field of Search ............................ 324/751; 250/310, 250/311

[56] References Cited

U.S. PATENT DOCUMENTS

| | | | |
|---|---|---|---|
| 4,755,748 | 7/1988 | Lin ........................................... | 250/310 |
| 4,807,159 | 2/1989 | Komatsu et al. ........................ | 364/524 |
| 5,521,517 | 5/1996 | Shida et al. .............................. | 324/751 |
| 5,592,100 | 1/1997 | Shida et al. .............................. | 324/751 |
| 5,640,098 | 6/1997 | Niijima et al. ........................... | 324/751 |
| 5,659,172 | 8/1997 | Wagner et al. .......................... | 250/307 |
| 5,703,492 | 12/1997 | Nakamura et al. ...................... | 324/751 |

OTHER PUBLICATIONS

PCT International Search Report PCT/US97/19739 Dated Apr. 27, 1998.

S. Mil'shtein, "Microelectronic Engineering—Beam Testing of the Electrical Field in Semiconductor Devices", Electrical Engineering Dept., Univ. of Mass., Mar. 1996.

S. Mil'shtein, et al., "Secondary Electrons Imaging of Metal–Semiconductor Field–Effect Transistor Operation", J. Vac. Sci. Technol. B 14(1), Jan./Feb. 1996.

S. Mil'shtein, et al., "Materials Science & Engineering B—Measurements of Interface Potentials in Quantum Wells", Electrical Engineering Dept., Univ. of Mass., Oct. 1995.

*Primary Examiner*—Josie Ballato
*Assistant Examiner*—Russell M. Kobert
*Attorney, Agent, or Firm*—Fish & Richardson P.C.

[57] ABSTRACT

A method for testing a semiconductor device wherein an image produced from secondary electron emissions generated by exposing a cross section of the device to a beam of electrons with such device being in a first biased condition, preferably an unbiased condition, is digitally recorded in a memory of a digital computer. An image is produced from secondary electron emissions generated by exposing a cross section of the device to a scanning beam of electrons with such device being in a second biased condition is digitally recorded in the memory of the digital computer. The recorded images are digitally subtracted one from the other in the digital computer to produce a difference image. The digital computer digitally calculates a quantitative measure of voltage distribution across the exposed cross section from two regions in the difference image having different degrees of secondary electron emissions. The digital computer displays one of the digitally recorded images on a video display. The other one of the digitally recorded images is subsequently displayed on the video display and the identifiable regions of the two displayed images are identifiable on both displayed images.

19 Claims, 3 Drawing Sheets

METHOD FOR TESTING SEMICONDUCTOR DEVICES WHICH MEASURES INTERNAL POTENTIAL DISTRIBUTION, INTERNAL ELECTRIC FIELD, AND INTERNAL DOPING PROFILE

BACKGROUND OF THE INVENTION

This invention relates generally to methods for testing semiconductor devices and more particularly for testing semiconductor devices with an extremely high degree of precision.

As is known in the art, various techniques have been used to test unpackaged semiconductor devices. These techniques include the use of parameter testers and current vs. voltage (i.e., I-V) curve tracers. However, recording of a rejection or deviation from a designed parameter neither identifies the reason for a failure nor provides suggestions as to whether there is room for improvement in device performance.

SUMMARY OF THE INVENTION

A method is provided for testing a semiconductor device wherein a first image is produced from secondary electron emissions generated by exposing a cross section of the device to a beam of electrons in a scanning electron microscope. During the exposure, the device is in a first biased condition, preferably an unbiased condition. The image is digitally recorded into the memory of a digital computer. A second image is produced from secondary electron emissions generated by exposing the same cross section of the device to a beam of electrons with such device being in a second biased condition. The second image is digitally recorded in the memory of the digital computer. The recorded images are digitally subtracted one from the other in the digital computer to produce a difference image. The difference image is stored in the memory of the digital computer. The digital computer calculates a quantitative measure of voltage distribution across the exposed cross section from two regions in the difference image corresponding to locations on the device having different predetermined voltage potentials.

With such method, a quantitative technique is provided for measuring the voltage, electric field and electric charge distribution in a semiconductor device. The method utilizes the intensity contrast change resulting from different secondary electron emissions produced by the semiconductor under different bias conditions to thereby determine the voltage on the exposed surface of the device. More particularly, this intensity contrast change is the result of local voltage potentials enhancing, or retarding, the emission of secondary electrons detected by a scanning electron microscope (SEM). Because the SEM also detects morphological features of the exposed surface of the device (i.e., structural features of the device which produce light intensity contrasts which are independent of voltages applied to the device), the method separates these morphological light intensity contrasts from applied voltage producing light intensity contrasts. The separation of these two effects is provided by subtracting an image of an unbiased device from an image of the biased device of the same area under the different biasing conditions to thereby eliminate substantially all morphological feature light intensity contrasts. Preferably, this requires that the two images (i.e., the unbiased image and the biased image) be aligned such that all morphological features on one of the two images are subtracted from the same morphological features on the other one of the two images. After alignment, a difference image is produced having a resulting light intensity contrast which is correlated with the light intensity contrast produced by a pair of applied voltages to thereby enable computation of the voltage potential, electric field and electric charge distribution in the exposed portion of the device.

In accordance with another feature of the invention, the digital computer displays one of the digitally recorded images on a video display. An attendant provides alignment marks on the video display having fixed relationship with bias condition independent identifiable characteristics of the displayed image (i.e., morphological features of the device). The marks are stored in the memory of the computer. The first image is removed from the display while the alignment marks remain displayed by the computer on the video display. The other one of the digitally recorded images is subsequently displayed on the video display together with the display of the alignment marks. Preferably, the identifiable regions (i.e., morphological features) of the two displayed images are identifiable on both displayed images. The attendant aligns the alignment marks on the video display with the same identifiable characteristics (i.e., morphological features) of the subsequently displayed image.

In accordance with another feature of the invention, the quantitative measure of voltage potential distribution across the exposed cross section is calculated from only two regions (i.e., the regions of known potential).

In accordance with still another feature of the invention, the identification marks are formed by the digital computer as a single, pointing device, moveable template of the marks. The template is moveable as a unit on the video display by movement of the pointing device by the attendant. The template is moved to align the alignment marks on the video display with identifiable characteristics of the subsequently displayed image.

BRIEF DESCRIPTION OF THE DRAWING

Other features of the invention, as well as the invention itself, will become more readily apparent from the following detailed description taken together with the accompanying drawings, in which.

DESCRIPTION OF THE PREFERRED EMBODIMENTS

Figure 1A:
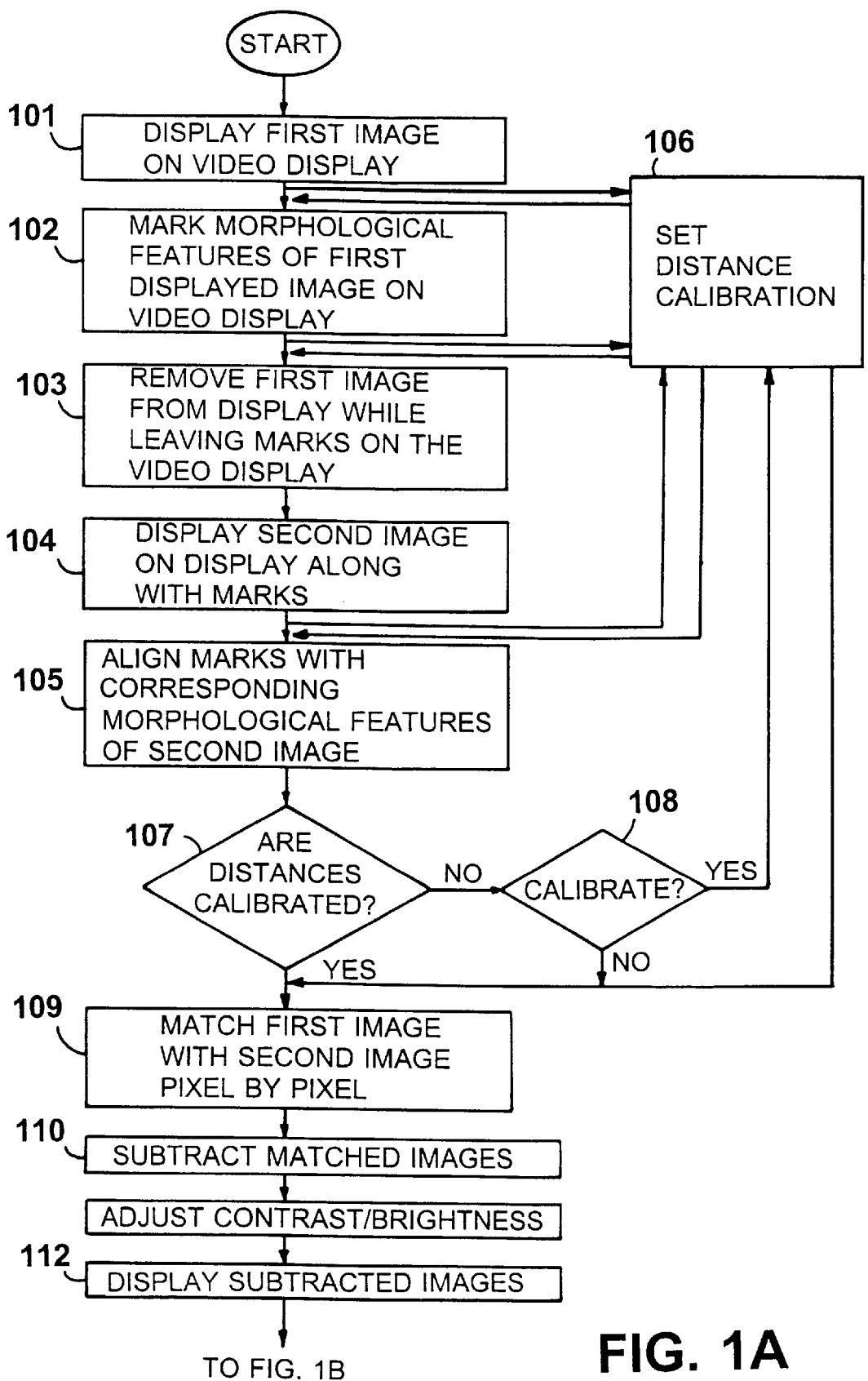
FIGS. 1A and 1B when taken together show a flow diagram of a computer program adapted for use in testing a semiconductor device in accordance with the invention.
Figure 1B:
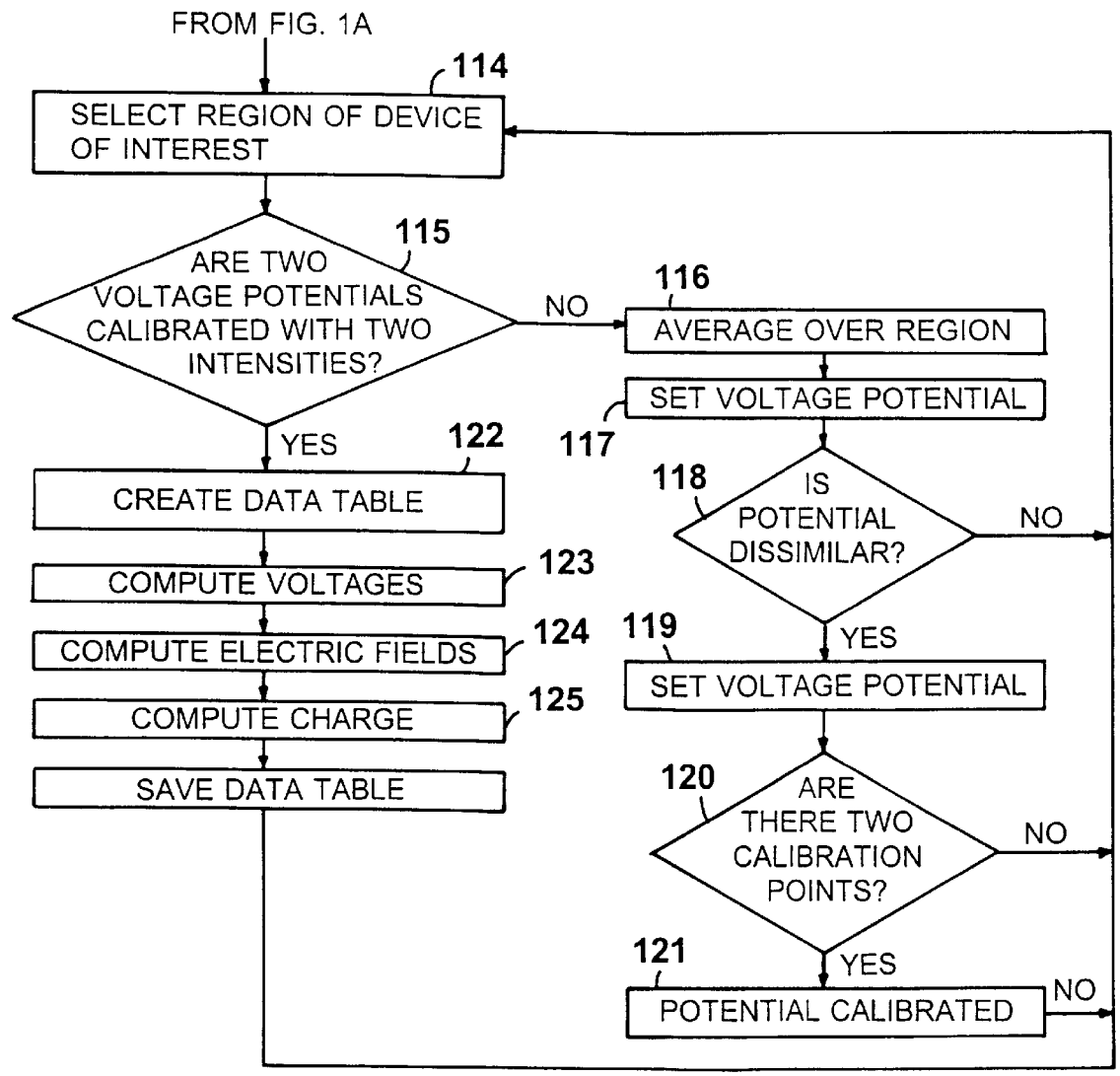

Referring now to FIGS. 1A and 1B, a computer program adapted operate digital computer is shown. The computer may be a conventional personal computer (PC) shown in FIG. 2. More particularly, the digital computer has a central processor, pointing device, here a mouse, memory and a video display is shown. The computer program is here stored on a readable medium, such as a magnetic disk. The program is loaded into the memory (i.e. RAM) of the computer. When read by the computer, the computer executes instructions stored on the medium, now stored in RAM, to perform method steps shown in FIGS. 1A and 1B.

The method provides for testing a semiconductor device. As will be described in more detail, a first image is produced from secondary electron emissions generated by exposing a cross section of the device to a beam of electrons. During the exposure, the device is in a first biased condition, preferably an unbiased condition. The image is digitally recorded in a memory of a digital computer. A second image is produced from secondary electron emissions generated by exposing the cross section of the device to a beam of electrons with such device being in a second biased condition. The second image is digitally recorded in the memory of the digital computer. The recorded images are digitally subtracted one from the other in the digital computer to produce a difference image. The difference image is stored in the memory of the digital computer. The digital computer calculates a quantitative measure of voltage distribution across the exposed cross section from two regions in the difference image having different degrees of secondary electron emissions.

Thus, with such method, a quantitative technique is provided for measuring the voltage potential, electric field and electric charge distribution in a semiconductor device. The method utilizes the light intensity contrast change resulting from different secondary electron emissions produced by the semiconductor under different bias conditions to thereby determine the voltage potential on the exposed surface of the device. More particularly, as described in an article written by myself and D. Kharas entitled "Measurement of interface potentials in quantum wells" published December 1995 in Materials Science and Engineering B35 (1995) 299–302, the contents thereof being incorporated herein by reference, the voltage potential distribution across the device will alter the flow of secondary electron emissions which form the SEM image. That is, the positive biased side of the device will retard the flow of secondary electron emissions to the SEM detector and will appear darker than the negatively charged portion of the device. This light intensity contrast change resulting from local voltage potentials enhancing, or retarding, the emission of secondary electrons is detected by a scanning electron microscope (SEM). Because the SEM also detects morphological features of the exposed surface of the device (i.e., structural features of the device which produce light intensity contrasts which are independent of voltages applied to the device), the method separates these morphological light intensity contrast producing effects from applied voltage producing light intensity contrasts. Such separation of these two effects is provided by subtracting an image of an unbiased device from an image of the biased device of the same area under the different biasing conditions to thereby eliminate substantially all morphological features. Preferably, this requires that the two images (i.e., the unbiased image and the biased image) be aligned such that all morphological features on one of the two images are subtracted from the same morphological features on the other one of the two images. After alignment, the difference image has a resulting light intensity contrast is correlated with the applied voltages to enable computation of the voltage potential, electric field and electric charge distribution in the exposed portion of the device.

Figure 2:
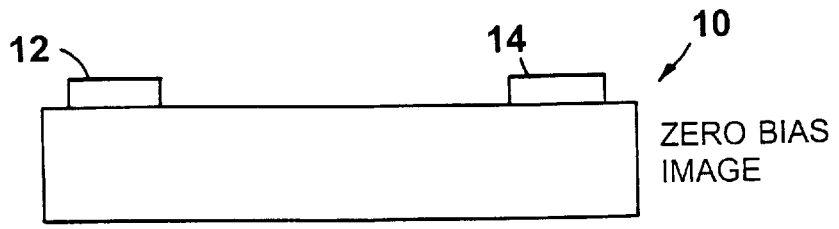
FIG. 2 is a cross-section diagrammatical sketch of an SEM image of a semiconductor device in an un-biased condition taken in accordance with the invention.

Thus, referring to FIG. 2, a semiconductor device 10 having a pair of electrodes 12, 14 is exposed to a raster scanned beam of electrons from a scanning electron microscope (SEM). Secondary electron emissions are detected by the SEM. Here, the SEM operates with accelerating voltages between 1 and 5 kV so as not to produce radiation damage to the device. The intensity of the incident beam should be minimal to prevent disruption of charge distribution with the device. In order to avoid carbonization of the device, measurements should be taken for no more than 15–20 minutes.

The image produced from secondary electron emissions generated by exposing a cross section of the device to a beam of electrons with such device being in the unbiased condition is digitized and recorded in the memory of the digital computer. Here a video capture board, here produced by GW Electronics, takes the analog signals produced by the SEM detector, digitizes the analog signals, and then displays them on the video display of the digital computer. Thus, the computer reads the digitized image from memory, here from a magnetic disk, and displays it on the video display. As noted above, the device is in the unbiased condition during this process. It is also noted that the brightness and light intensity contrast of the video display should be set such that no clipping of the image occurs, i.e., such that the video display amplifiers are operated in their linear region. It is noted that morphological light intensity contrasts are produced from the electrodes and surface edges. It is noted that the light intensity of each pixel in the image is stored in a location of the computer memory.

Next, a second image is produced from secondary electron emissions generated by exposing a cross section of the device to a beam of electrons with such device being in a second biased condition. In like manner, the second image is digitally recorded in the memory of the digital computer. (i.e., again the video capture board is used to digitize the analog signals produced by the detector of the SEM, and then displays them on the video display of the digital computer). It is noted that the same morphological light intensity contrasts are produced from the same electrodes and surface edges as were produced when the device was in the unbiased condition. Again, the light intensity of each pixel in the second image is stored in a location of the computer memory.

Having stored the two images, a test is performed on the semiconductor device. First, an attendant, here a technician, activates the computer to read the first image from the computer memory (i.e., a light intensity for each pixel in the image) and displays the light intensity for each pixel as a corresponding brightness on the display terminal (Step 101). The image formed with the device in the unbiased condition is typically the first image loaded, but the order of loading may be reversed. The image of the device 10 in the un-biased condition is diagrammatically shown in FIG. 2.

Figure 3:
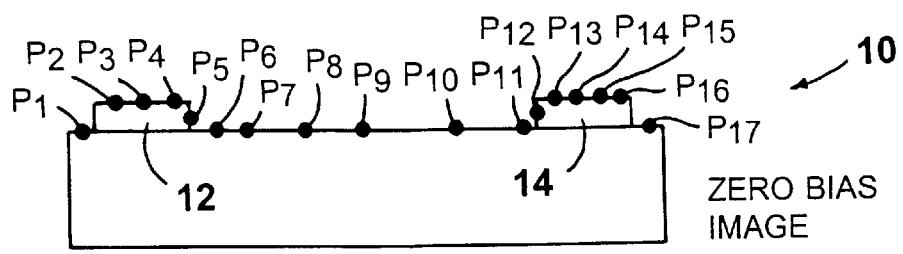
FIG. 3 is a cross-section diagrammatical sketch of an SEM image of the semiconductor device in the un-biased condition together with alignment marks placed on the image.

Next, as indicted in Step 102, the attendant, using a pointing device, here a mouse, places marks $P_1$–$P_{17}$ on the displayed image as shown in FIG. 3 to outline features (i.e., identifiable morphological features) whose appearance and/or position are not dependant on applied bias voltages. These morphological features may be, for example, scratches, dust, physical edges, electrodes; however, p-n junctions or borders of depleted regions which change with applied bias voltage should not be selected. These marks record the coordinates of the pixels having the physical features and will be used in correcting shifting in the second image, to be described.

More particularly, the attendant provides alignment marks on the video display having fixed relationship with identifiable characteristics (i.e., morphological features) of the displayed image. The identification of the marks is made by the attendant positioning the mouse (i.e., the conventional mouse generated arrow, not shown, drawn by the computer on the video display) at locations on the image where there are permanent features, i.e., morphological features on the device which will not change with a bias voltage applied to the device. Such morphological features may include the electrodes of the device, a physical mark on the device, an outline of a metalization or insulation material. As the feature is pointed at by the attendant with the mouse, the attendant clicks, i.e., activates the mouse, and the computer, in response to each mouse activation, places a mark, here a dot $P_1$–$P_{17}$, on the video display at the position the mouse was pointing to at the time of its activation. Also, the computer stores in its memory the x,y positions of the displayed dot. Upon completion of the marking process, the computer forms the marks as a single moveable template on the video display. The first image is removed from the display while the computer continues to display the alignment marks on the computer display. (Step 103.)

Next, as indicated in Step 104, the second image is loaded and displayed on the video display with a brightness for each pixel corresponding to the light intensity of such pixel which, as noted above, had been stored in the computer memory. The marks $P_1$–$P_{17}$ made with the first image are also displayed and appear positioned on the display at exactly the same location as they were when the first image was displayed, as indicated in FIG. 3, where the second image (i.e., the image of the device 10 in the biased condition) is shown in FIG. 3 as image 10'. The attendant then assesses how much the identified feature in the second image 10' has shifted, or rotated, from the first image 10 (FIG. 1), more particular;y from the alignment marks $P_1$–$P_{17}$. This shifting occurs quite often and must be corrected. Using the mouse, the marks $P_1$–$P_{17}$ are moved and/or rotated, as a unit, until they once again outline the same identified physical feature the outlined when the first image was displayed.

Figure 4:
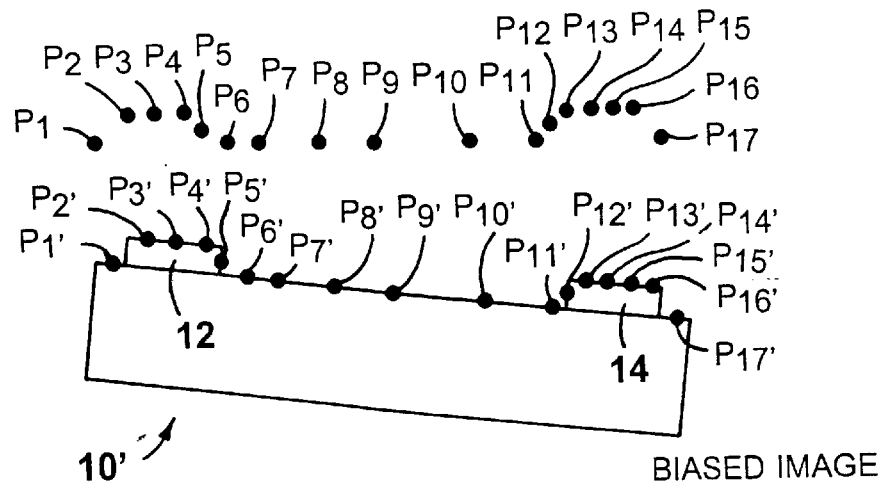
FIG. 4 is a cross-section diagrammatical sketch of an SEM image of the semiconductor device a biased condition together with the alignment marks shown before and after alignment with the image of the device in the biased condition.

Next, in Step 105, the attendant uses the pointing device to move, or drag, the template of marks $P_1$–$P_{17}$ formed by the computer as a unit on the video display to align the alignment marks, i.e., the template, on the video display with the same identifiable characteristics (i.e., morphological features) of the displayed second image 10' of the device (i.e., the image taken by the SEM with the device in the biased condition), as shown in FIG. 4. That is, the digitally recorded image 10' (FIG. 4) of the biased device is subsequently displayed on the video display together with a display of the alignment marks $P_1$–$P_{17}$. Preferably, the identifiable regions of the two displayed images are identifiable on both displayed images. The attendant aligns the alignment marks $P_1$–$P_{17}$ on the video display with identifiable characteristics (morphological features) of the subsequently displayed image, such moved or repositioned alignment marks being shown as dots $P'_1$–$P'_{17}$, respectively, in FIG. 4. (Thus, as shown in FIG. 4, the positions of the alignment marks $P_1$–$P_{17}$ have been realigned and now appear as indicated by dots $P'_1$–$P'_{17}$ in FIG. 4. Thus, when so positioned, the pixel position of each alignment mark $P'_1$–$P'_{17}$ is now associated with a pixel position of the second image which has a common morphological feature. That is, the computer matches each pixel of the second image with each pixel in the first image, as shown in FIG. 4. The computer therefore has, for each pixel of the device, extremely accurate knowledge of the light intensity for each pixel when the device was unbiased and when the device was biased.

In Step 106, the relationship between the length and width of the device to a dimension of known length along one axis of the image is determined. Thus, if X is the dimension along the X axis, the distance, x, to a point at x on the device along the X axis is given by:

$S_x$=W/L=x scaling factor and the distance, y, to a point at y on the device along the X axis is given by:

$S_y$=H/L=y scaling factor;

where L is the scale on the image, H is the height of the image (in distance) and W is the width of the image.

Under most circumstances, the ratios W/L and H/L will not change for a particular SEM. With an Hitachi S-570 SEM, W/L is preferably 2.8 and H/L is 3.6. It should be noted that if the surface of the device being imaged is tilted, such may need to be taken into account when calculating W/L and H/L. That is, in Step 104, the dimensions of the image must be set, or calibrated. The attendant inputs the height (H) and width (W) of one of the images (both images being on the same scale), as described above. Now, the pixel x, y coordinates can be transformed into distance the scales: If a pixel is in the mth column and nth row, and the whole image has M columns and N rows, x=[m/M]$S_x$L y=[n/M]$s_y$L It should be noted that $S_x$ and $S_y$ are only calculated once for each SEM and will not change unless the samples are titled.

Next, in Steps 107–110, after both images are matched on a pixel by pixel basis by the computer, the light intensity for such pixel when the device was biased one way is subtracted from the light intensity for the same pixel when the device was biased the other way. That is, the two aligned, i.e., computer matched, images are subtracted. More particularly, once the two images are aligned by the attendant, the computer memory stores the biased image of the device in its memory along the unbiased image; the common, identified morphological features pointed to by the attendant now having the same positions in a common coordinate system. The recorded, and now computer aligned, images of the biased device and the unbiased device are digitally subtracted by the computer one from the other in the digital computer to produce a difference image. The computer can use smoothing algorithms on the difference image. Here, the smoothing algorithm uses a weighted average of a 5×5 matrix of video display pixels centered around each pixel. When smoothing is used, it is applied to all images. For example, if smoothing is applied just before subtraction, the subtracted image will be that of the first two images after smoothing. In such case, the subtracted image itself will be smoothed, resulting in a doubly smooth subtracted image. Therefore, if it is desired to have a subtracted image from two smooth images, smoothing should be performed on each image before the subtraction computation. The use of double smoothing produces the least noisy difference image; however it increases loss of detail. The difference image is stored in the memory of the digital computer. The intensity levels of the difference image are stored as an array of pixel bytes quantized into a range from 0 to 256.

In Step 107, a check as to whether the distances have been calibrated as in Step 106. If not, the attendant is alerted. Distance calibration cannot occur after subtraction as the corrections for imaging shifting may change the width and height of the subtracted image. In Step 108, if calibration has not been set, the attendant is prompted by the computer to indicate whether calibration should be set. If the attendant answers "yes", the subtraction process is stopped to allow the user to set the distance calibration. If answered "no", the attendant is informed that the distance scale will be set by the computer and the subtraction process is continued. In Steps 109 and 110, the pixel intensity (i.e., Gray scale) of the first image is subtracted from the corresponding pixel intensity of the second image. The subtraction is done for all pixels that overlap on the two images. The result of the subtraction is stored as a new image file, i.e., the difference image.

It is noted that the subtraction process can at times produce negative intensity values, which the computer translates to very large positive values. If uncorrected, this would invalidate the data. If the difference in intensity of two images was small, the subtracted image can end up having very little light intensity contrast. In Step 111, the computer corrects the light intensity contrast and brightness of the image to maximized the light intensity contrast and prevent the appearance of negative pixel intensities. More particularly, the program scans the subtracted image first in a format that is not capable of being displayed, but which allows negative numbers. It determines the maximum and minimum pixel intensities and then adjusts the contrast and brightness of the image such that the minimum pixel intensity is zero and the maximum intensity is the highest pixel value. In Step 112, the subtracted image (i.e., the difference image) is displayed on the video terminal for calibration and data extraction.

More particularly, once the difference image is calculated and the light intensities as a function of x,y position in the device, the difference image are stored in the memory as a bit map and is displayed (Step 112.) The stored bit map is used to calibrate potentials in the device, and used to make, and store a data table. More particularly, in order to calibrate the potentials within the device, two areas, or regions of known potential are selected. While the region of known potential will vary from device to device, for a field effect transistor, the known potentials would typically be +5 volts and ground which are applied between the source and drain electrodes of the biased device. Thus, the two regions selected are preferably associated with regions of known potential.

Next, in Step 114, using the mouse, a rectangular region is selected by the attendant, for either the purpose of calibrating the regions average pixel intensity with a known potential, or to extract data from the region. More particularly, with the difference image displayed on the display terminal, the attendant selects a first one of the regions by pointing with the mouse at such region and then holding down the mouse button to activate the mouse. With the button held down, the computer forms a rectangular shaped image on the display which enlarges in area as the attendant drags the mouse outwardly to enclosed the desired first region of known potential. The average pixel intensity in the selected area is computed and stored in the memory. The process is repeated at the second known potential area. No more than two areas should be selected. Thus, in Step 115, a check is made to determine if two potentials have been calibrated. The two regions, for example a source electrode at +5 volts and a drain electrode at ground potential) are correlated with a known potential (Steps 116–121; here the highest and lowest potentials (here +5 volts and ground). Thus, each of the two light intensity regions in the device is now associated for a corresponding one of the two known voltage potentials (here ground and +5 volts).

Next, the area in the device which is of interest to test the device is selected by the attendant using the mouse and a rectangular area formed by the computer on the display device enlarged to the desired area size by dragging the mouse from a corner of the rectangle. Once the area is selected, the attendant presses the mouse to activate storage of the light intensities of the pixels falling within the rectangular shaped enclosed region.

In Step 116, if the region selected is for potential calibration, the pixel intensities from the whole region are averaged. In Step 117, the computer prompts the attendant for the desired potential to equate with the selected region. In Step 118, a check is made by the computer to determine if the user is trying to assign two potentials to regions with the same average pixel intensity. In Step 119, the computer equates the average pixel intensity of the selected region with the attendant defined potential. In Step 120, a determination is made as to whether two regions have been calibrated with known potentials. If, the two regions have been calibrated, the image is recorded (Step 121).

In Step 122, after the two known potentials have been calibrated with the light intensities associated therewith in the manner described above, the attendant selects a region of interest. The computer prompts the attendant for the name of the file to save the data in, whether to read the whole region, or whether to read every nth pixel, and whether to invert the data table. More particularly, a dialog box may be presented on the video display for the attendant requesting the frequency of sampling on the X and Y axes. Thus, if, for example, 3 is selected for the X axis, then the intensity in the pixel in only every third column will be recorded. The pixel intensity data is here formatted as ASCII numbers in columns separated by tabs.

In Step 123, the computer converts the pixel intensities into a voltage potential distribution across the device. In step 124, the computer takes the first derivative of the voltage potentials to obtain the electric field. In Step 125, the computer takes the second derivative of the voltage potential distribution to obtain charge distribution across the device. In Step 126, the computer saves the voltage potential, electric field and charge distribution with the distance scale to the specified file.

More particularly, there are three sets of data recorded. The first is the voltage potential profile (i.e, volts) with the selected region of the device, the second is electric field intensity profile (i.e. volts/cm), and the third is charge concentration. The charge concentration is directly read from the pixel intensity using the two region voltage calibration described above. The electric field is calculated by taking the second derivative of the voltage potential surrounding each pixel that was recorded. Theses calculations are bases on Poisson's equation providing the relationship between voltage potential and charge concentration. Under certain circumstances, the doping profile of the device may be derived from charge concentration. Thus, the digital computer digitally calculates a quantitative measure of voltage potential distribution across the exposed cross section from two regions in the difference image having different degrees of secondary electron emissions.

Other embodiments of the invention are within the spirit and scope of the appended claims. For example, while here the first image taken and displayed was with the device in the unbiased condition, the first image taken and displayed may have been with the device in the biased condition. Further, the following functions can be applied by the computer at any time during its processing: Reducing high frequency noise by taking a weighted local average of pixels; and, Using Fourier analysis to remove a selected frequency, such as 60 Hz, which might be interfering with the image.

What is claimed is:

1. A method for testing a semiconductor device comprising the steps of:

recording an image generated from secondary electron emissions generated by exposing a cross section of the device to a scanning beam of electrons with such device being in an unbiased condition in a memory of a digital computer;

recording an image produced from secondary electron emissions generated by exposing the same cross section of the device to a beam of electrons with such device being in a biased condition in the memory of the digital computer;

digitally subtracting one of the recorded images are from the other one of the recorded images in the digital computer to produce a difference image;

storing the difference image in the memory of the digital computer;

calculating with the digital computer a quantitative measure of internal voltage potential distribution across the exposed cross section from two regions of known potential of the device in the difference image.

2. The method recited in claim 1 including the step of displaying on a video display terminal of the digital computer one of the digitally recorded images on a video display;

providing alignment marks on the video display having fixed relationship with identifiable characteristics of the displayed image; and storing positions of the marks in the memory of the computer.

3. The method recited in claim 2 including the step of subsequently displaying the other one of the digitally recorded images the video display together with a display of the alignment marks, the identifiable regions of the two displayed images are identifiable on both displayed images.

4. The method recited in claim 3 including the step of aligning the alignment marks on the video display with identifiable characteristics of the subsequently displayed image.

5. The method recited in claim 4 wherein the quantitative measure of voltage potential distribution calculation across the exposed cross section step comprises the step of calculating such measure from only two regions of known potential within the exposed cross section.

6. The method recited in claim 5 including the step of having the digital computer consider the marks as a single template moveable as a unit on the video display by a pointing device in aligning the alignment marks on the video display with identifiable characteristics of the subsequently displayed image.

7. A method for testing a semiconductor device, comprising the steps of:

digitally recording an image produced from secondary electron emissions generated by exposing a cross section of the device to a beam of electrons with such device being in a first biased condition;

digitally recording an image produced from secondary electron emissions generated by exposing a cross section of the device to a scanning beam of electrons with such device being in a second biased condition;

subtracting the digitally recorded images one from the other to produce a difference image;

digitally calculating from two regions of known potential of the device in the difference image having different degrees of secondary electron emissions, a quantitative measure of internal voltage potential distribution across the exposed cross section.

8. The method recited in claim 7 wherein the step of subtracting includes the steps of:

displaying one of the digitally recorded images on a video display;

providing alignment marks on the video display having fixed relationship with identifiable characteristics of the displayed image;

subsequently displaying the other one of the digitally recorded images;

aligning the alignment marks on the video display with identifiable characteristics of the subsequently displayed image.

9. The method recited in claim 8 where the first biased condition is an unbiased condition.

10. The method recited in claim 9 wherein the identifiable regions of the two displayed images are identifiable on both displayed images.

11. The method recited in claim 10 wherein the two regions are of known potential.

12. The method recited in claim 11 wherein the step of digitally calculating from two regions in the difference image having different degrees of secondary electron emissions, a quantitative measure of voltage potential distribution across the exposed cross section comprises the step of performing such calculation from only said two regions.

13. The method recited in claim 12 wherein the subtraction step includes the step of digitally forming the marks as a single template with the marks being moveable as a unit on the video display and wherein the aligning the alignment marks on the video display with identifiable characteristics of the displayed image includes the step of moving the single template into alignment with the identifiable characteristics of the subsequently displayed image.

14. The method recited in claim 13 wherein the two regions are associated with predetermined bias voltages used to provide the second bias to the semiconductor device.

15. The method recited in claim 14 wherein the video display is arranged as an array of pixels and wherein the step of subtracting the digitally recorded images one from the other to produce a difference image comprises the step of determining an average secondary electron emission level in the two selected regions and the step of digitally calculating a quantitative measure of voltage distribution across the exposed cross section comprises the step of using the determined average secondary electron emission levels.

16. A computer readable storage medium having stored therein a computer program executable by a computer for performing a method comprising the steps of:

digitally subtracting a pair of images produced by secondary electron emissions generated by exposing a cross section of the device to a scanning beam of electrons, one image being produced with the device in an unbiased condition and the other image being produced with the device having a potential applied thereto to determine a quantitative measure of internal voltage distribution across the exposed cross section from two regions in the difference image.

17. The medium recited in claim 16 wherein the computer program upon execution by the computer includes the step of:

displaying on a video display terminal of the digital computer one of the digitally recorded images on a video display;

storing positions of alignment marks stored in the memory of the computer, such alignment marks on the video display having fixed relationship with identifiable characteristics of the displayed image.

18. The medium recited in claim 17 wherein the computer program upon execution by the computer includes the step of subsequently displaying the other one of the digitally recorded images the video display together with a display of the alignment marks, the identifiable features of the two displayed images being identifiable on both displayed images.

19. The medium recited in claim 18 wherein the computer program upon execution by the computer includes the step of having the digital computer consider the marks as a single template moveable as a unit on the video display by a pointing device in aligning the alignment marks on the video display with identifiable characteristics of the subsequently displayed image.

* * * * *